United States Patent
Maréchal et al.

(10) Patent No.: US 10,024,933 B2
(45) Date of Patent: Jul. 17, 2018

(54) METHOD AND CONTROL DEVICE FOR GENERATING MAGNETIC RESONANCE IMAGES

(71) Applicant: Siemens Aktiengesellschaft, Munich (DE)

(72) Inventors: Bénédicte Maréchal, Lausanne (CH); Davide Piccini, Prilly (CH)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 525 days.

(21) Appl. No.: 14/681,295

(22) Filed: Apr. 8, 2015

(65) Prior Publication Data

US 2015/0293196 A1    Oct. 15, 2015

(30) Foreign Application Priority Data

Apr. 15, 2014   (DE) .................. 10 2014 207 236

(51) Int. Cl.
*G06K 9/00* (2006.01)
*G01R 33/34* (2006.01)
(Continued)

(52) U.S. Cl.
CPC .......... *G01R 33/34* (2013.01); *G01R 33/543* (2013.01); *G01R 33/3415* (2013.01)

(58) Field of Classification Search
None
See application file for complete search history.

(56) References Cited

U.S. PATENT DOCUMENTS

2005/0275402 A1* 12/2005 Campagna ......... G01R 33/3415
                                                              324/309
2008/0031546 A1   2/2008 Yamada et al.
(Continued)

FOREIGN PATENT DOCUMENTS

DE    102004026996 A1    12/2005
DE    102010017432 A1    1/2011
DE    102010061977 A1    5/2012

OTHER PUBLICATIONS

Pruessmann et al.: "SENSE: Sensitivity Encoding for Fast MRI," *Magnetic Resonance in Medicine*, No. 42, pp. 952-962, 1999.
(Continued)

*Primary Examiner* — Vu Le
*Assistant Examiner* — Samah Beg
(74) *Attorney, Agent, or Firm* — Harness, Dickey & Pierce, P.L.C.

(57) ABSTRACT

A method for acquiring raw data for generating image data of a target organ via a magnetic resonance system is described. In an embodiment, test raw data is initially acquired from a measurement region including at least the target organ using a plurality of magnetic resonance coils. Test image data is reconstructed from the test raw data. Furthermore, a mask defining the position and the dimensions of the target organ is generated using the reconstructed test image data. The magnetic resonance coils, to be used for the image acquisition, are then selected. This takes place on the basis of intensity values from a region covered by the mask and intensity values of a measurement region lying outside of the mask. Finally, the measurement is performed by acquiring raw data via the selected magnetic resonance coils. Furthermore, a device for acquiring raw data for generating image data is also described.

16 Claims, 3 Drawing Sheets

(51) Int. Cl.
*G01R 33/54* (2006.01)
*G01R 33/3415* (2006.01)

(56) References Cited

U.S. PATENT DOCUMENTS

| | | | | |
|---|---|---|---|---|
| 2009/0080746 | A1* | 3/2009 | Xu | A61B 5/055 382/131 |
| 2009/0228299 | A1* | 9/2009 | Kangarloo | G06F 19/321 705/2 |
| 2010/0166269 | A1* | 7/2010 | Logan | A61B 5/0077 382/128 |
| 2010/0264923 | A1* | 10/2010 | Heberlein | G01R 33/5611 324/309 |
| 2010/0322488 | A1* | 12/2010 | Virtue | A61B 5/055 382/128 |
| 2011/0006766 | A1* | 1/2011 | Jurrissen | G01R 33/022 324/307 |
| 2011/0095762 | A1* | 4/2011 | Piccini | G01R 33/4824 324/312 |
| 2011/0235883 | A1* | 9/2011 | Nakagawa | G06T 7/12 382/131 |
| 2012/0112751 | A1* | 5/2012 | Littmann | A61B 5/055 324/322 |
| 2012/0133361 | A1 | 5/2012 | Gross | |
| 2015/0293198 | A1* | 10/2015 | Grodzki | A61B 5/055 324/309 |
| 2016/0091584 | A1* | 3/2016 | Feiweier | G01R 33/543 324/309 |

OTHER PUBLICATIONS

Griswold et.al.: "Generalized Autocalibrating Partially Parallel Acquisitions (GRAPPA)," *Magnetic Resonance in Medicine*, vol. 47, pp. 1202-1210, 2002.

Piccini et al.: "Respiratory Self-Navigation for Whole-Heart Bright-Blood Coronary MRI: Methods for Robust Isolation and Automatic Segmentation of the Blood Pool," *Magnetic Resonance in Medicine*, vol. 68, pp. 571-579, 2012.

Xue et. al.: "Automatic Coil Selection for Streak Artifact Reduction in Radial MRI," *Magnetic Resonance in Medicine*, vol. 67, pp. 470-476, 2012.

German Report on Examination dated Jan. 23, 2015 for corresponding DE Application No. 102014207236.0.

* cited by examiner

METHOD AND CONTROL DEVICE FOR GENERATING MAGNETIC RESONANCE IMAGES

PRIORITY STATEMENT

The present application hereby claims priority under 35 U.S.C. § 119 to German patent application number DE 102014207236.0 filed Apr. 15, 2014, the entire contents of which are hereby incorporated herein by reference.

FIELD

At least one embodiment of the invention generally relates to a method for acquiring raw data for the purpose of generating image data of a target organ via a magnetic resonance system. At least one embodiment of the invention furthermore generally relates to a method for generating image data. At least one embodiment of the invention additionally generally relates to a device for acquiring raw data for the purpose of generating image data of a target organ by way of a magnetic resonance system. At least one embodiment of the invention finally generally relates to a magnetic resonance system.

BACKGROUND

Modern magnetic resonance systems generally operate with a plurality of different antennas (called coils in the following) for transmitting radiofrequency pulses in order to excite nuclear resonance and/or for receiving the induced magnetic resonance signals. Normally, a magnetic resonance system possesses a relatively large whole-body coil which is permanently installed in the device. The whole-body coil is typically arranged in the shape of a cylinder—e.g. having a so-called "birdcage" structure—around the patient receiving chamber in which the patient is positioned on the patient support table during the measurement. One or more small local coils or surface coils are frequently used in addition in a tomography apparatus.

For more extensive examinations, a plurality of coil arrays (multicoil receiver arrays), each including a number of interconnected coils, are often even placed on and/or under the patient. These local coils serve for acquiring detailed images of a patient's bodily parts or organs which are located relatively close to the body surface. For this purpose the local coils are applied directly at the point on the patient at which the region to be examined is located. When such a local coil is used, pulses are in many cases transmitted by way of the whole-body coil (as transmit coil), and the induced magnetic resonance signals are received via the local coil (as receive coil).

In order to generate good-quality magnetic resonance images it is undoubtedly important to select, from the plurality of coils present in the device, precisely the coils that are particularly suitable for a specific measurement of a specific measurement region, i.e. for example a specific slice or a stack of slices or, as the case may be, a volume within the measurement object. This has hitherto been done manually in the prior art by inputting corresponding selection commands at a control terminal of the tomography apparatus. In this case the operator makes a selection according to whether the coil in question is located in a suitable position relative to the region that is to be imaged in the following measurement and has an appropriate illumination zone, i.e. whether the region of interest can be measured at all by way of the coil.

For coils having a fixed position relative to the patient support table, this position is in some case specified explicitly ex works. This position is then essentially known to the magnetic resonance system, i.e. in the control device of the magnetic resonance tomography apparatus, even if the coil can usually be displaced within a small range. Alternatively, the position can for example also be measured explicitly prior to the magnetic resonance measurement. Often only the position in the z-direction, i.e. in the longitudinal direction of the patient support table, is usually measured in this case. The coordinates perpendicular thereto continue to be unknown as previously and are estimated at a likely average value ex works by certain manufacturers. An illumination zone can also be specified ex works for each coil. In this case, however, this is simply an estimated illumination zone that is to be expected on average. In particular it is not taken into account in this case whether the zone is also actually filled by a load during a measurement or whether the illumination zone has a shape due to the load that is quite different from the specified shape, for example a rectangle.

The correct choice of coils accordingly requires a considerable degree of knowledge and experience on the part of the operator, in particular because in practice the available information specified ex works in relation to positions and illumination zones of the coils is often not sufficiently precise and does not take into account the real circumstances for the live measurement. If the optimal coil or coil combination is not chosen for a subsequent measurement, then the quality of the subsequent image acquisitions will inevitably also deteriorate. In certain cases this may lead to the need to repeat the image acquisitions once more, which increases the total acquisition time. This not only reduces the efficiency of the magnetic resonance tomography apparatus and of the operating staff, but above all results also in the patient being exposed to a higher load.

A further reason for acquiring images of individual organs of patients via magnetic resonance tomography using a receive coil system comprising a plurality of coils, a so-called "multicoil receiver array", is the faster image acquisition. Methods such as parallel imaging, for example, find application in this case. This explains the trend toward equipping MRT systems with more and more RF coils. It is therefore particularly important to safeguard the quality of the acquired images in order not to risk a repetition of the acquisitions, since in such a case the time advantage of the multicoil receiver arrays would be forfeited again. While it is true that the majority of the coil elements contribute toward improving the signal-to-noise ratio (SNR), the coils arranged further away from the target region of the image acquisition cause an increase in the noise level, since for these the greatest signal contribution comes from regions of the patient that do not belong to the target region. With radial imaging especially, a large number of peripheral coils can lead to increased streaking artifacts, in particular in the case of image planes in the longitudinal axis. It may therefore be beneficial to deactivate some of the coils prior to the measurement. It is, however, difficult to establish individually in advance for a specific object, which coil elements will produce artifacts and/or intensify the noise.

A possible approach is to determine the most suitable coils for a particular target organ in a post-processing step by visual inspection. Although this method can be very precise, it is time-consuming and cannot be applied to a real-time reconstruction because the selection of the best coils must be made retrospectively. If a predefined, fixed set of coil elements selected prior to the image acquisition and not dependent on actual individual conditions is used, it is probable that the set is not optimized to the particular examination subject.

In a conventional method for reducing noise and the signal-to-noise ratio, a linear combination of the coil elements is used in order to optimize the signal-to-noise ratio of the image of the target organ that is to be acquired, based on the sensitivity characteristics and noise statistics of the receiver coils. In another conventional approach, the case of radial imaging in particular is considered, where the extent of the streak artifacts in the images of each individual coil is evaluated by comparing them with a filtered, low-resolution image.

In yet another alternative approach, the signals of the different coil elements are combined by taking into account the specific hardware characteristics and the position of the object that is to be imaged. For example, in the acquisition of images of the heart, it is taken into account that the heart is positioned close to the center of the bodycoil. However, the two latter approaches in particular cannot be applied in a generalized manner. The former method requires a high computational overhead and occupies a proportionately long amount of time, which reduces the level of comfort for patients. If it is simplified and for example does not take precisely into account the individual dimensions of the organ to be examined, the result is not optimal.

SUMMARY

An embodiment of the invention involves a method for improving the signal-to-noise ratio and for reducing noise or, as the case may be, artifacts when using magnetic resonance systems having a plurality of magnetic resonance coils, which method overcomes the described limitations of the conventional approaches.

An embodiment of the invention is directed to a method. An embodiment of the invention is directed to a device. An embodiment of the invention is directed to a magnetic resonance system. And an embodiment of the invention is directed to a computer program.

In the method according to an embodiment of the invention, test raw data for generating diagnostic wanted image data from a measurement region comprising at least the target organ is acquired using a plurality of magnetic resonance coils. This test raw data can be acquired at low resolution in order to enable this step to be performed in the shortest possible time. The test image data is subsequently reconstructed in the spatial domain from the test raw data acquired by the plurality of magnetic resonance coils. A test image is therefore generated which comprises the target organ that is to be imaged. The reconstructed test image data can be stored for example in a test image data memory. In addition, a mask which defines the position and the dimensions of the target organ is generated with the aid of the reconstructed test image data.

The mask can be generated, for example, by way of a template taken from a database. The mask and the acquired test image are then registered with one another, for example. In other words, in the event that the mask is registered to the acquired test image, the shape of the mask of one or more target organs is aligned for example to the contours of the target organ or target organs on the test image. Conversely, it is also possible to register the test image to the mask. This, however, leads to a deformation of the structures of the test image.

Furthermore, the magnetic resonance coils that are to be used for the image acquisition are selected for each individual magnetic resonance coil on the basis of intensity values from a region covered by the mask and intensity values of a measurement region lying outside of the mask. To put it another way, images are reconstructed for each individual magnetic resonance coil from the raw data assigned to each individual coil. It is determined, on the basis of the images or part-images, which pixel intensity values are achieved in the region covered by the mask for each individual coil and the values are compared or correlated for example with a global average pixel intensity value for each individual coil.

On this basis it is determined which magnetic resonance coils contribute most to the imaging of the target organ and generate the fewest artifacts. The raw data of the target organ is then acquired by way of the magnetic resonance coils. In other words, the actual measurement takes place using only the selected magnetic resonance coils.

The magnetic resonance coils can preferably be selected on the basis of a plurality of magnetic resonance coils that have been determined for example by way of a preselection. For example, it is not necessary, for acquisition of a magnetic resonance tomography image in the region of the knee of a patient, to take into account also the local coils located at the head of the patient, since with this positioning it can be assumed from the outset that the coils are not able to illuminate the desired region. It therefore makes sense under certain conditions to select in the first instance a group of coils which are theoretically suitable candidates for the measurement, and then to perform the method according to an embodiment of the invention for these coils only.

The device according to an embodiment of the invention comprises a test raw data acquisition unit which is configured to acquire test raw data from a measurement region comprising at least the target organ using a plurality of magnetic resonance coils. In addition, the device has a test image data reconstruction unit which is configured to reconstruct test image data from the test raw data acquired by the plurality of magnetic resonance coils. Furthermore, the device comprises a mask generation unit which is configured to generate a mask defining the position and the dimensions of the target organ with the aid of the reconstructed test image data. The device according to the invention also has a selection unit which is configured to select, on the basis of intensity values from a region covered by the mask and intensity values of a measurement region lying outside of the mask for each individual magnetic resonance coil, the magnetic resonance coils that are to be used for the image acquisition. Finally, the device also comprises a raw data acquisition unit which is configured to acquire raw data by way of the selected magnetic resonance coils.

In the method according to an embodiment of the invention for generating image data, raw data is initially acquired in accordance with an embodiment of the inventive method for acquiring raw data, and image data is subsequently reconstructed from the raw data. The raw data is acquired and reconstructed in each case using the magnetic resonance coils selected previously by way of the method according to an embodiment of the invention or, as the case may be, on the basis of the raw data acquired by the magnetic resonance coils.

The magnetic resonance system according to an embodiment of the invention has the device according to an embodiment of the invention for acquiring raw data, by which device in particular a selection of magnetic resonance coils for the subsequent acquisition of images of a target organ can be made.

The computer program according to an embodiment of the invention, which can be loaded directly into a memory of the magnetic resonance system, has program code sections for the purpose of performing all steps of the method according to an embodiment of the invention for acquiring raw data.

An implementation largely in software has the advantage that already existing magnetic resonance tomography systems can easily be retrofitted by way of a software update in order to operate in the inventive manner.

The dependent claims and the following description contain particularly advantageous developments and embodiments of the invention; in particular the claims of one category can also be developed analogously to the dependent claims of a different claims category. Furthermore, features of different example embodiments can also be combined with one another in any desired manner.

BRIEF DESCRIPTION OF THE DRAWINGS

The invention is explained once again in more detail below on the basis of example embodiments and with reference to the attached figures. Like components are labeled with identical reference numerals throughout the various figures. The figures are generally not to scale. They show.

DETAILED DESCRIPTION OF THE EXAMPLE EMBODIMENTS

Figure 1:
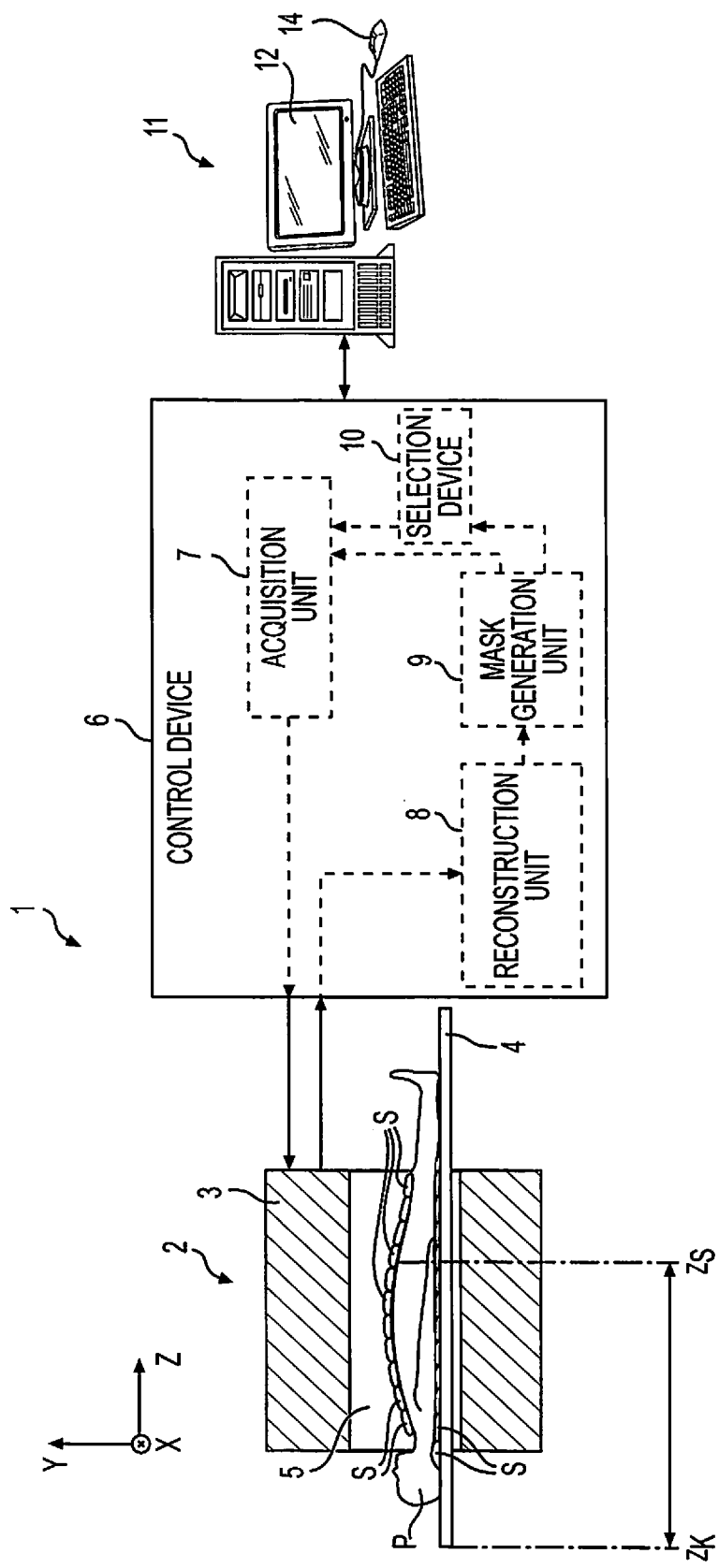
FIG. 1 a schematic view of a magnetic resonance system according to an example embodiment of the invention, FIG. 2 a schematic representation of a method according to a first example embodiment of the invention, and FIG. 3 a schematic representation of method according to a second example embodiment of the invention.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code sections to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

According to a preferred variant of an embodiment, in order to determine the intensity values for each individual magnetic resonance coil from the raw data of the test image for each individual magnetic resonance coil of the plurality of magnetic resonance coils, a coil-specific test image assigned to the magnetic resonance coil is reconstructed. The intensity values or, as the case may be, the pixel intensities can subsequently be inferred from the reconstructed part-image data.

As already mentioned, the determined test image data and a template image can be registered with one another for the purpose of generating the mask. As a result of the registration step a transformation function is specified by which a reference mask is subsequently directly or inversely transformed using the transformation function for the purpose of generating the mask, with the result that the position and the dimensions of the mask are identical to the position and the dimensions of the target organ of the test image. The transformed mask therefore corresponds in terms of its position and its dimensions to the target organ that is to be imaged, for example.

According to a variant of an embodiment of the inventive method, the template image is segmented for the purpose of generating the mask, with the result that a reference mask is generated which defines the position and the dimensions of the target organ in the template image.

For the selection of the magnetic resonance coils used for the image acquisition, a weighting value is advantageously calculated for each magnetic resonance coil on the basis of the determined intensity values, the weighting value resulting, in an advantageous version of the method according to the invention, for each individual magnetic resonance coil, from the quotient from the average intensity value for the region covered by the mask and the average intensity value for the entire measurement region of the coil-specific test image. The more contributions the individual coils therefore make toward the imaging of the target organ, the higher also the weighting values they receive assigned to them. For example, it is then possible to select, from the plurality of magnetic resonance coils, those magnetic resonance coils for the diagnostic wanted image acquisition that have a weighting value which exceeds a predetermined threshold value.

In one embodiment of the method according to an embodiment of the invention, all of the magnetic resonance coils of the magnetic resonance system are used for the acquisition of test raw data. This is beneficial when no preselection of the magnetic resonance coils has been made on the basis of other criteria, such as the relative position of the magnetic resonance coils with respect to the target organ, for example.

As already mentioned, it is beneficial to perform the acquisition of the test raw data at a low resolution compared to the resolution of the following image acquisition. In this case, in an imaging of the heart, for example, there is no need to take into consideration cardiac motion or respiratory motions.

If all of the magnetic resonance coils of a magnetic resonance system are used for the acquisition of the test raw data, the data acquired in the process is normally also used in its entirety in order to reconstruct the test image data for generating the mask by way of the test raw data acquired by all of the magnetic resonance coils of the magnetic resonance system.

In a particularly readily realizable embodiment of the method according to an embodiment of the invention, a template image of the target organ is selected as a function of the patient type for the purpose of generating the mask.

It may furthermore be beneficial to allow the determined weightings of the individual coils to be incorporated as well during the reconstruction of the image data from the raw data. For example, although the reconstruction takes place using all of the magnetic resonance coils or, more specifically, the raw data received by these, these are weighted during the reconstruction in accordance with the determined weightings.

FIG. 1 shows a first example embodiment of an inventive magnetic resonance system which is able to operate according to the inventive method. At the core of the magnetic resonance system 1 is the magnetic resonance tomography apparatus 2 itself, in which a patient P is positioned on a patient support table 4 (also called a support board 4) in a ring-shaped basic field magnet 3 which encloses the measurement chamber 5. A plurality of local coils S, also called magnetic resonance coils, are located on and where appropriate also under the patient.

The support board 4 is displaceable in the longitudinal direction, i.e. along the longitudinal axis of the tomography apparatus 2. This direction is designated in the likewise represented space coordinate system as the z-direction. Located inside the basic field magnet in the tomography apparatus 2 is a whole-body coil (not shown in any further detail) by which radiofrequency pulses can be transmitted and received. The tomography apparatus 2 also has in the typical manner (not shown in the figure) gradient coils so that a magnetic field gradient can be applied in each of the spatial directions x, y, z.

The tomography apparatus 2 is actuated by a control device 6, which in this case is shown separately. A terminal 14 is connected to the control device 6. The terminal 14 has a screen 17, a keyboard 15 and a pointing device for a graphical user interface, for example a mouse 16 or the like. The terminal 14 serves among other functions as a user interface via which an operator operates the control device 6 and therefore the tomography apparatus 2. Both the control device 6 and the terminal 14 can also be an integral part of the tomography apparatus 2.

Furthermore, the magnetic resonance system 1 can also have all other typical components or features of such systems, such as e.g. interfaces for connecting a communications network, for example an image information system or the like. For better clarity of illustration, however, none of these components are shown in FIG. 1.

An operator can communicate with the control device 6 by way of the terminal 14 and thus take responsibility for performing the desired measurements by, for example, ensuring that the tomography apparatus 2 is actuated by the control device 6 in such a way that the necessary radiofrequency pulse sequences are transmitted via the radiofrequency coils and the gradient coils are switched in a suitable manner. The test raw data TRD coming from the tomography apparatus and required for the method according to the invention is also acquired by way of the control device 6. For that purpose the control device 6 inventively includes a test raw data acquisition unit 7.

Test raw data is reconstructed into test image data in a signal evaluation unit 8, also called a test image data reconstruction unit, which can be e.g. a module of the control device 6. The image data can be visualized for example on the screen 17 of the terminal 14 and/or stored in a memory or, alternatively, be sent over a network. In order to carry out the method according to an embodiment of the invention, the control device 6 additionally has a mask generation unit 9 by which a mask is generated which defines the position and the dimensions of the target organ with the aid of the reconstructed test image data TBD. The test image data reconstruction unit 8 additionally serves to reconstruct, for each individual magnetic resonance coil S, from the test raw data of each individual magnetic resonance coil, a coil-specific part-image TBi assigned to the magnetic resonance coil.

The part-image data TBDi assigned to the coil-specific part-image TBi, together with the data in respect of the generated mask of the organ that is to be imaged, is then transferred to the selection device 10, which makes a selection from the available magnetic resonance coils on the basis of intensity values Pmaski obtained from the part-image data TBDi from a region covered by the mask and intensity values Pouti obtained from the part-image data TBDi from a measurement region lying outside of the mask, for example the entire measurement region acquired by the individual magnetic resonance coil with the exception of the region covered by the mask. The information relating to the selected coils is then passed on for example to a measurement workflow control device 11 which may also be responsible, for example, for performing the actually desired imaging magnetic resonance measurement.

Finally, the control device 6 also comprises a raw data acquisition unit 12 by which the raw data (RD) of the organ to be examined is acquired in the actual measurement via the selected magnetic resonance coils. The raw data acquisition unit 12 can be identical to the test raw data acquisition unit 7 or, alternatively, it can comprise the test raw data acquisition unit 7. In order to conduct the measurement, the measurement workflow control device 11 actuates for example the whole-body coil in the tomography apparatus 2 so that a radiofrequency signal is transmitted at the requisite resonance frequency and the gradients are appropriately switched and so that the received magnetic resonance signals are then read out via the individual selected local coils Si.

The measurement raw data captured during this measurement arrives at the raw data acquisition unit 12 in the control device 6. Subsequently, the acquired measurement data can be further processed in an evaluation unit 13 which comprises for example an image data reconstruction unit. The image data reconstruction unit can for example be the test image data reconstruction unit 8. It can, however, also be embodied separately therefrom.

The components necessary for implementing at least one embodiment of the invention in a magnetic resonance system 1, such as the actuation unit 11, the test raw data acquisition unit 7, the evaluation device 8, the mask generation unit 9, the selection device 10, the measurement workflow control device 11, the raw data acquisition unit 12 and the evaluation unit 13, can be produced in their entirety or predominantly in the form of software components.

Conventional magnetic resonance systems include programmable control devices in any case, so the invention can be realized in this way preferably with the aid of suitable control software. In other words, a corresponding computer program product having program code sections for performing the method according to an embodiment of the invention is loaded directly into the memory of a programmable control device 6 of the magnetic resonance system 1 in question. In this way, already existing magnetic resonance systems can also be easily and cost-effectively retrofitted.

In particular it is possible for some of the components to have been realized also as subroutines in components that are already present in the control device 6 or for existing components to be used in addition for the inventive purpose. This applies for example to the measurement workflow control device 11, which may essentially be a measurement workflow control device 11 that is already present in an existing control device 6 and is intended for driving the radiofrequency coils, gradient coils or other components in the tomography apparatus in a suitable manner in order to perform a typical imaging measurement. Toward that end a modification could for example be made to the measurement workflow control device by way of a suitable software subroutine. Similarly, in particular also the evaluation device 8 can be embodied as a submodule of a general image evaluation unit.

Figure 2:
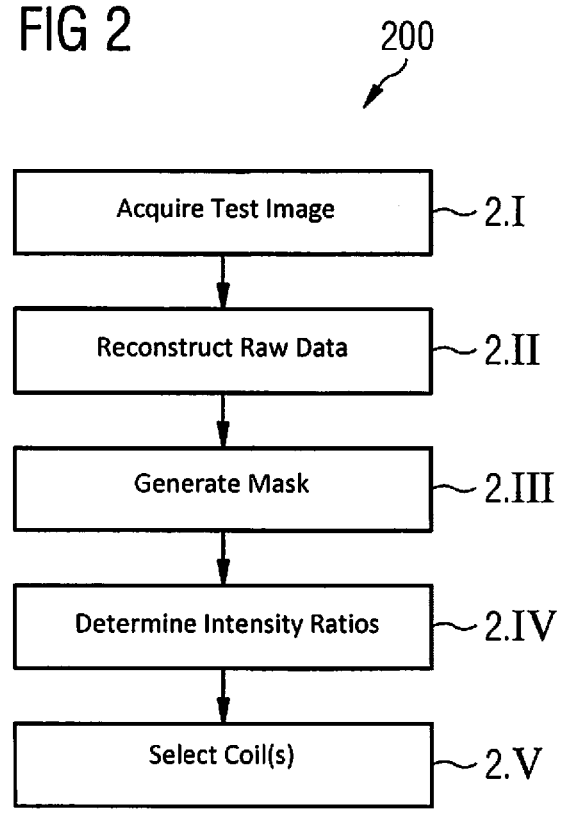

A possible workflow of the inventive method according to a first example embodiment is explained once again below by way of example with reference to the flowchart in FIG. 2. At step 2.I, a test image TB of a target object is acquired at a low resolution. More precisely, test raw data TRD is acquired from a measurement region comprising at least the target organ using a specific number of coils. Thanks to the low resolution, this acquisition can be accomplished in a short time.

In an acquisition scan of the heart, for example, it is sufficient to acquire a dataset by way of a fast radial 3D sequence without triggering the cardiac motion and without taking a respiratory motion into consideration. The raw dataset assigned to the image acquisition is used in a second step 2.II for image reconstruction taking into account the test raw data TRD that was acquired by way of the previously specified coils. The test image dataset resulting therefrom is used in a third step 2.III for generating a mask M specifying the position and the dimensions of the target organ. At step 2.IV, the intensity ratios are determined for each individual coil Si for example from an average intensity Pmaski assigned to the region covered by the mask M and the average intensity Pouti assigned to the region lying outside of the mask.

In other words, a part-image TBi is reconstructed for each individual coil Si from the raw data RDi received by the coil Si, and which proportion of the signal energy has fallen onto the region defined by the mask M is determined. This proportion can be divided for example by the total signal energy received by the coil Si. The weighting value Wi obtained as a result is used in order to select, in a step 2.V, the magnetic resonance coils S that are to be used for the image acquisition. For example, those magnetic resonance coils S can be selected that have an assigned weighting value exceeding a specific threshold value.

Figure 3:
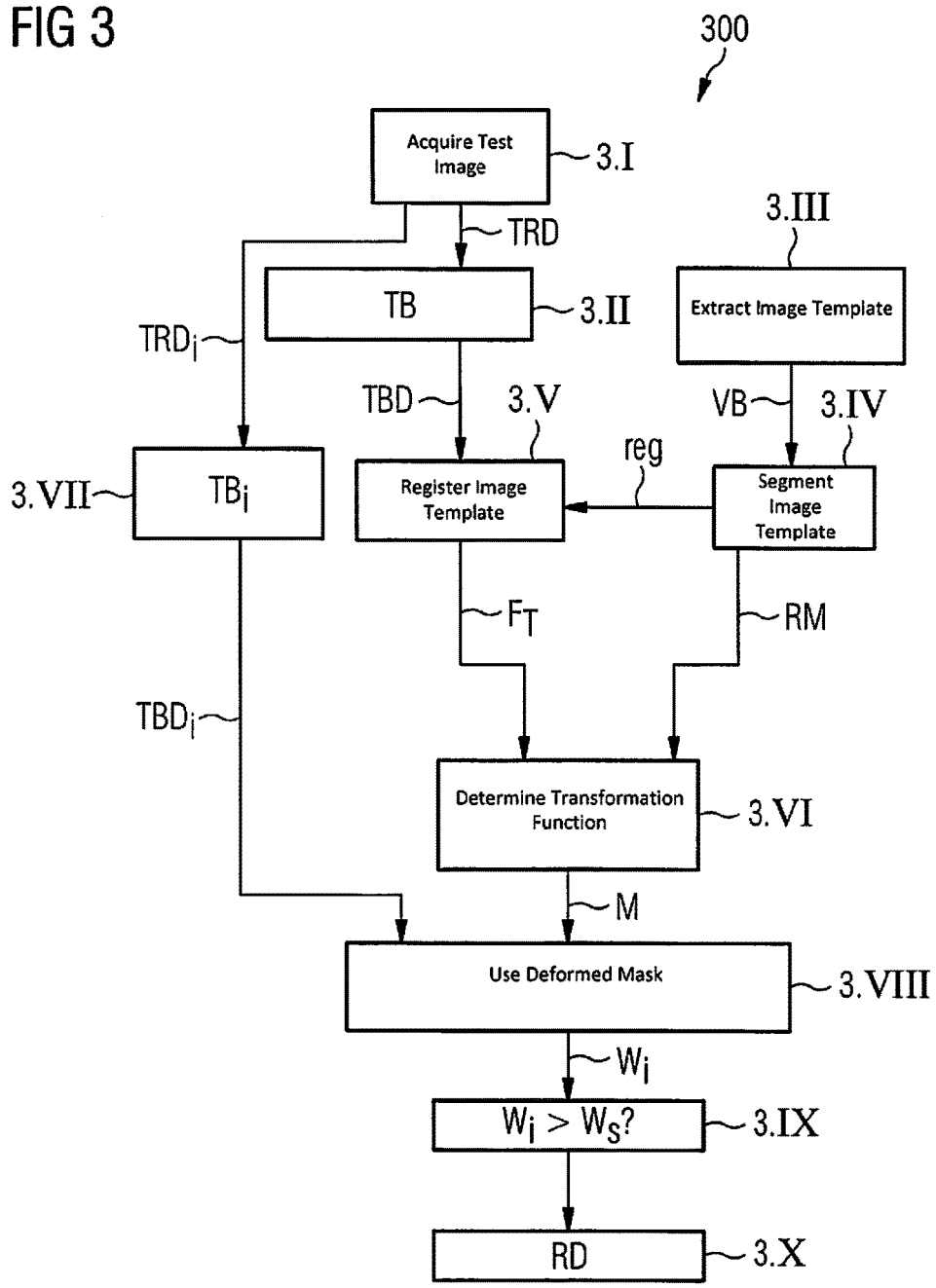

A selection method according to a second example embodiment of the invention is shown in detail in FIG. 3. Steps 3.I and 3.II correspond to the steps in FIG. 2. At step 3.III, an image template VB of a target object, in particular a target organ, is initially extracted from a database, for example. The image template VB is segmented in a step 3.IV, i.e. the domain of the target organ is specified. More precisely, the position and the dimensions of the target organ are specified and a reference mask RM of the organ that is to be imaged is generated.

In a step 3.V, the image template VB is then registered to the determined image data TBD of the test image TB. This is indicated in FIG. 3 by "reg" on the arrow between step 3.IV and step 3.V. Expressed graphically, the image template is aligned to the test image. From this, in a step 3.VI, a transformation function $F_T$ is determined which maps the region defined by way of the reference mask RM onto the target organ imaged in the test image. To put it another way, the reference mask RM is deformed in such a way that it is adapted to fit the target organ acquired in the test image TB.

A mask M is generated as a result of the deformation. In step 3.VII, a part-image $TB_i$ is reconstructed in each case for each individual magnetic resonance coil $S_i$ from the test raw data $TRD_i$. At step 3.VIII, the deformed mask M is used as a reference volume in order to determine which proportion $Pmask_i$ of the energy or intensity $P_i$ received by each individual coil is to be assigned to the reference volume defined by the mask M. This can be realized for example by calculation of a quotient from an average value of a pixel intensity $P_i(x_{mask})$ of the pixels within the reference volume covered by the mask M and an average value of the pixel intensities $P_i(x_{mask})$ and $P_i(x_{out})$ outside and inside the mask M. This quotient can be determined as a weighting value $W_i$ of each individual coil $S_i$.

The weighting values assigned to the individual magnetic resonance coils are therefore calculated according to the following formula:

$$W_i = \frac{\sum_x P_i(x_{mask})}{\sum_x P_i(x_{mask}) + \sum_x P_i(x_{out})} \quad (1)$$

where $W_i$ is the respective weight assigned to a specific coil element, $P_i(x_{mask})$ represents an intensity value for a pixel of the image volume inside the mask, and $P_i(x_{out})$ represents an intensity value for a pixel outside of the mask. At step 3.IX, the coils are arranged in descending order according to their assigned weighting values $W_i$, the highest weighting values representing the best visualization of the signals from the target organ. A selection of the most suitable coils $S_i$ is then made. For example, all magnetic resonance coils having weighting values $W_i$ below a specific threshold value $W_s$ can be excluded from the following measurement. At step 3.X, the actual measurement, i.e. the acquisition of images of the target organ, is carried out using the selected magnetic resonance coils.

In conclusion it is pointed out once again that the devices described in detail in the foregoing are merely example embodiments which can be modified in the most diverse ways by the person skilled in the art without leaving the scope of the invention. In particular, the above-described features of the variants can, where appropriate, also be combined with one another. Furthermore, the use of the indefinite articles "a" or "an" does not exclude the possibility that the features in question may also be present more than once. Equally, the terms "unit" and "element" do not rule out the possibility that the components in question may consist of a plurality of interacting sub-components, which, where appropriate, may also be spatially distributed.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for acquiring raw data for generating image data of a target organ via a magnetic resonance system, the method comprising:
acquiring test raw data from a first measurement region using a plurality of magnetic resonance coils, the first measurement region including at least the target organ;
reconstructing test image data from the test raw data acquired by the plurality of magnetic resonance coils, the test image data including the target organ;
generating a mask based on the reconstructed test image data, the mask defining a position and dimensions of the target organ;
selecting at least one of the plurality of magnetic resonance coils for image acquisition based on intensity values from a region covered by the generated mask and intensity values of a second measurement region, the second measurement region being outside of the generated mask for each magnetic resonance coil, the selecting including,
calculating a weighting value for each magnetic resonance coil, the weighting value for each magnetic resonance coil resulting from a quotient based on intensity values for the region covered by the mask and intensity values for an entire measurement region of a coil-specific test image for the magnetic resonance coil, and
selecting the at least one of the plurality of magnetic resonance coils based on the weighting value for the at least one of the plurality of magnetic resonance coils and a threshold value, the weighting value of the at least one of the plurality of magnetic resonance coils exceeding the threshold value; and
acquiring the raw data for generating the image data via the selected at least one of the plurality of magnetic resonance coils.

2. The method of claim 1, further comprising:
determining the intensity values for each magnetic resonance coil including assigning a coil-specific part-image to the magnetic resonance coil and reconstructing the coil-specific part-image from the test raw data of each magnetic resonance coil of the plurality of magnetic resonance coils.

3. The method of claim 2, wherein, the generating the mask includes registering determined test image data and a template image to one another and obtaining a transformation function from the registering.

4. The method of claim 3, wherein the generating the mask includes segmenting the template image such that a reference mask is generated which defines the position and the dimensions of the target organ in the template image.

5. The method of claim 4, wherein the generating the mask includes transforming the reference mask using the transformation function.

6. The method of claim 1, wherein the generating the mask includes registering determined test image data and a template image to one another and obtaining a transformation function from the registering.

7. The method of claim 6, wherein the generating the mask includes segmenting the template image such that a reference mask is generated which defines the position and the dimensions of the target organ in the template image.

8. The method of claim 7, wherein the generating the mask includes transforming the reference mask using the transformation function.

9. The method of claim 1, wherein all of the magnetic resonance coils of the magnetic resonance system are used for the acquisition of the test raw data.

10. The method of claim 1, wherein the acquiring acquires the test raw data at a low resolution relative to a resolution of the following image acquisition.

11. The method of claim 1, wherein the reconstructing uses the test raw data acquired by at least one of the plurality of magnetic resonance coils.

12. The method of claim 1, further comprising:
selecting a template image of the target organ as a function of a patient type for generating the mask.

13. A method for generating image data, comprising:
acquiring the raw data for generating the image data according to the method of claim 1; and
reconstructing image data from the raw data for generating the image data.

14. A device for acquiring raw data for generating image data of a target organ via a magnetic resonance system, the device comprising:
a memory storing computer-readable instructions; and
at least one processor configured to execute the computer-readable instructions to,
acquire test raw data from a first measurement region using a plurality of magnetic resonance coils, the first measurement region including at least the target organ,
reconstruct test image data from the test raw data acquired by the plurality of magnetic resonance coils, the test image data including the target organ,
generate a mask defining position and dimensions of the target organ based on the reconstructed test image data, the mask defining a position and dimensions of the target organ,
calculating a weighting value for each magnetic resonance coil of the a plurality of magnetic resonance coils, the weighting value for each magnetic resonance coil resulting from a quotient based on intensity values for a region covered by the mask and intensity values for an entire measurement region of a coil-specific test image for the magnetic resonance coil,
select at least one of the magnetic resonance coils that are to be used for image acquisition based on based on the weighting value for the at least one of the plurality of magnetic resonance coils and a threshold value, the weighting value of the at least one of the plurality of magnetic resonance coils exceeding the threshold value, and
acquire raw data for generating the image data via the selected at least one of the magnetic resonance coils.

15. A magnetic resonance system comprising:
a magnetic resonance tomography apparatus; and
the device of claim 14.

16. A non-transitory computer-readable medium, when executed by the magnetic resonance system, configured to cause the magnetic resonance system to perform the method of claim 1.

* * * * *